(12) United States Patent
Park

(10) Patent No.: US 7,348,247 B2
(45) Date of Patent: Mar. 25, 2008

(54) SEMICONDUCTOR DEVICES AND METHODS OF MANUFACTURING THE SAME

(75) Inventor: Geon-Ook Park, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 344 days.

(21) Appl. No.: 10/981,987

(22) Filed: Nov. 5, 2004

(65) Prior Publication Data

US 2005/0130441 A1    Jun. 16, 2005

(30) Foreign Application Priority Data

Nov. 5, 2003    (KR) .................. 10-2003-0077926

(51) Int. Cl.
*H01L 21/336*    (2006.01)
(52) U.S. Cl. ............. 438/299; 438/591; 438/981; 148/DIG. 163
(58) Field of Classification Search ............... 438/981, 438/FOR. 490, 585, 591, 299, 770; 148/DIG. 163; 257/E21.192, E21.433
See application file for complete search history.

(56) References Cited

U.S. PATENT DOCUMENTS

| 4,170,492 | A | * | 10/1979 | Bartlett et al. .............. 438/298 |
| 4,642,881 | A | * | 2/1987 | Matsukawa et al. ......... 438/264 |
| 4,958,321 | A | * | 9/1990 | Chang .................... 365/185.3 |
| 5,086,008 | A | * | 2/1992 | Riva ......................... 438/201 |
| 5,422,505 | A | * | 6/1995 | Shirai ........................ 257/327 |
| 5,501,996 | A | * | 3/1996 | Yang et al. ................. 438/259 |
| 5,604,366 | A | * | 2/1997 | Lee ............................ 257/316 |
| 5,648,284 | A | * | 7/1997 | Kusunoki et al. .......... 438/286 |
| 5,801,416 | A | * | 9/1998 | Choi et al. .................. 257/335 |
| 5,918,133 | A | * | 6/1999 | Gardner et al. ............. 438/299 |
| 6,077,749 | A | * | 6/2000 | Gardner et al. ............. 438/299 |
| 6,121,666 | A | * | 9/2000 | Burr ........................... 257/408 |
| 6,200,843 | B1 | * | 3/2001 | Bryant et al. ............... 438/216 |
| 6,229,184 | B1 | * | 5/2001 | Riccobene .................. 257/368 |
| 6,297,535 | B1 | * | 10/2001 | Gardner et al. ............. 257/344 |
| 6,458,639 | B1 | * | 10/2002 | An et al. .................... 438/163 |
| 6,465,307 | B1 | * | 10/2002 | Chidambaram et al. .... 438/286 |
| 6,620,656 | B2 | * | 9/2003 | Min et al. ................... 438/149 |
| 6,707,112 | B2 | * | 3/2004 | Kachelmeier ............... 257/368 |
| 6,724,048 | B2 | * | 4/2004 | Min et al. ................... 257/347 |
| 6,743,688 | B1 | * | 6/2004 | Gardner et al. ............. 438/305 |
| 6,888,205 | B2 | * | 5/2005 | Moscatelli et al. ......... 257/406 |
| 6,979,858 | B2 | * | 12/2005 | Saito et al. ................. 257/315 |
| 7,078,354 | B2 | * | 7/2006 | Kanda ........................ 438/770 |
| 7,160,771 | B2 | * | 1/2007 | Chou et al. ................. 438/241 |
| 2001/0008808 | A1 | * | 7/2001 | Gonzalez ................... 438/770 |

FOREIGN PATENT DOCUMENTS

KR    100161398    8/1998

* cited by examiner

*Primary Examiner*—M. Wilczewski
(74) *Attorney, Agent, or Firm*—Andrew D. Fortney

(57) ABSTRACT

Semiconductor devices and methods of manufacturing the same are disclosed. A disclosed semiconductor device comprises a semiconductor substrate; a gate formed on the semiconductor substrate; a gate oxide layer interposed between the semiconductor substrate and the gate; and source and drain regions formed within the substrate at opposite sides of the gate. The gate oxide layer has a first region with a first thickness and a second region with a second thickness. The second thickness is thicker than the first thickness.

11 Claims, 4 Drawing Sheets

SEMICONDUCTOR DEVICES AND METHODS OF MANUFACTURING THE SAME

FIELD OF THE DISCLOSURE

The present disclosure relates generally to semiconductor devices and, more particularly, to semiconductor devices and methods of manufacturing the same.

BACKGROUND

A metal oxide silicon (MOS) transistor has a structure in which a gate is formed on a gate dielectric layer which, in turn, is deposited on a semiconductor substrate. The MOS transistor is a unipolar transistor in which current flows using electrons or holes. A positive or negative voltage can be applied at the gate of the MOS transistor. An inverse bias is not required. The input impedance of the gate is very high. Also, the MOS transistor can be manufactured through simple and cost effective fabrication techniques and can be highly integrated. Furthermore the MOS transistor exhibits low power consumption. Various methods for fabricating a MOS transistor have been described in the U.S. Pat. No. 6,458,639, U.S. Pat. No. 6,297,535, and U.S. Pat. No. 5,648,284.

FIG. 1 illustrates a conventional MOS transistor. Referring to FIG. 1, a gate oxide layer 12 and a gate 13 are formed on a semiconductor substrate 11. Source and drain regions 14a and 14b are formed within the semiconductor substrate 11 at opposite sides of the gate 13.

Typically, this MOS transistor is manufactured by forming the gate oxide layer 12 on the semiconductor substrate 11 at a uniform thickness; depositing a polysilicon layer as a gate material layer, patterning the polysilicon layer through photolithography, and performing etch processes to form the gate 13. Impurities are ion-implanted into the substrate 11 to form the source and drain regions 14a and 14b within the substrate 11 at opposite sides of the gate 13.

However, since the thickness of the gate oxide layer 12 is uniformly formed, when applying voltage to the drain region 14b after a channel is formed below the gate 13, the depletion layer 100 becomes thicker around the drain 14b than around the source region 14a due to the potential difference. Accordingly, if the electrons (e) emitted from the source region 14a flow to the drain region 14b, the speed of the electrons (e) becomes faster when the electrons reach the depletion layer around the drain region 14b such that a pinch-off point (A) occurs. The electrons (e) penetrate the gate oxide layer 12 around the pinch-off point (A), according to the speed of the electrons (e), the gate voltage, and so on. These electrons (e) become thermal electrons emitting heat due to frequent collisions with the interface of the gate oxide layer 12 and the silicon and their fast speed. The emitted heat may damage the gate oxide layer 12, resulting in degradation of the properties and/or the reliability of the transistor.

DETAILED DESCRIPTION

Figure 1:
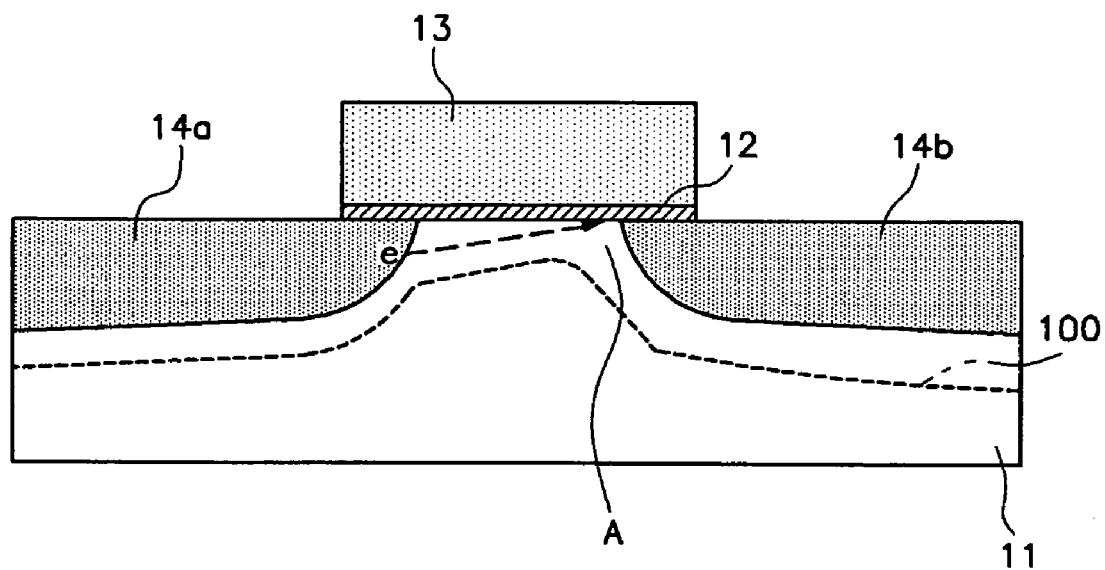
FIG. 1 is a cross sectional view illustrating a conventional MOS transistor.
Figure 2A:
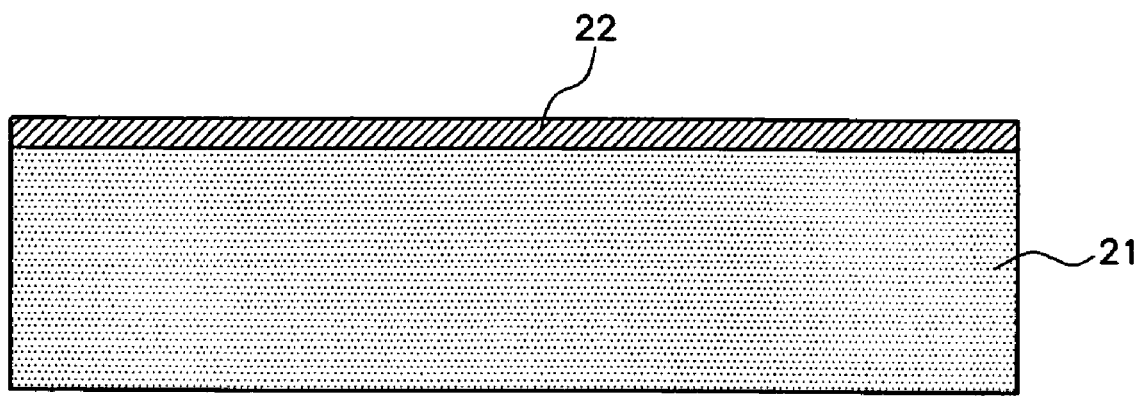
FIG. 2A to FIG. 2G are cross sectional views illustrating an example method for manufacturing a MOS transistor performed in accordance with the teachings of the present invention.

FIG. 2A to FIG. 2G are cross sectional views illustrating an example method for manufacturing a MOS transistor. Referring to FIG. 2A, a nitride layer 22 is deposited on a semiconductor substrate 21 at a thickness of approximately 500 Å. The semiconductor substrate 21 is a silicon substrate, and the nitride layer 22 is a silicon nitride layer formed through a thermal treatment process or a plasma enhanced-chemical vapor deposition (PECVD) process.

Figure 2B:
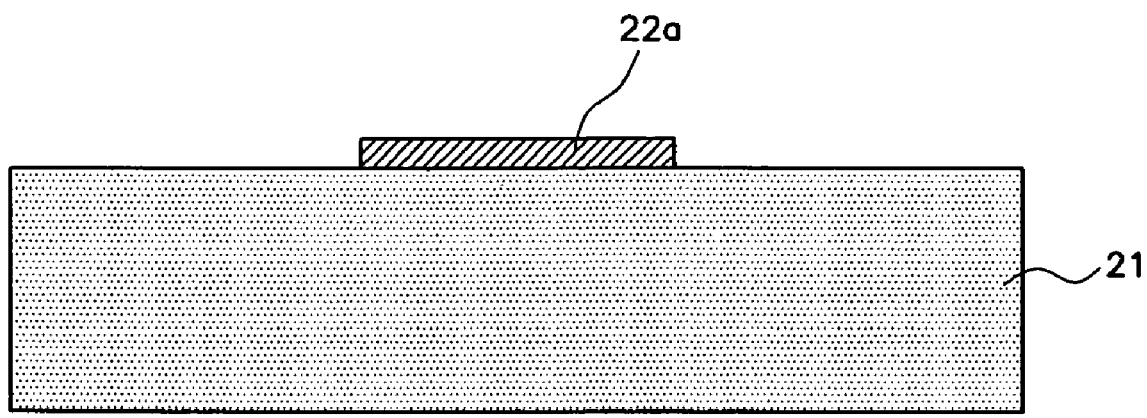

Referring to FIG. 2B, a first photoresist pattern (not shown) is formed through a photolithography process using a gate mask (not shown) on the nitride layer 22. A mask pattern 22a is then formed at a gate region of the semiconductor substrate 21 by etching the nitride layer 22 using the first photoresist pattern as a mask. Thereafter, the first photoresist pattern is removed by a well known method.

Figure 2C:
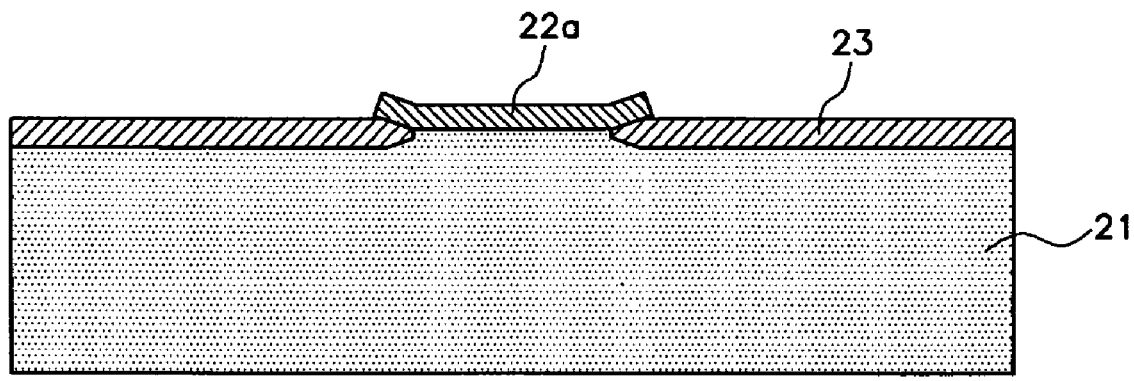

Referring to FIG. 2C, a first oxide layer 23 is formed by growing a thick silicon oxide layer on the semiconductor substrate 21 exposed through the mask pattern 22a by the thermal treatment process. The first oxide layer 23 is not formed under the mask pattern 22a. However, oxygen penetrates around the edges of the mask pattern 22a to grow the silicon oxide layer under the edges of the mask pattern, thereby creating a Bird's beak effect at the first oxide layer 23.

Figure 2D:
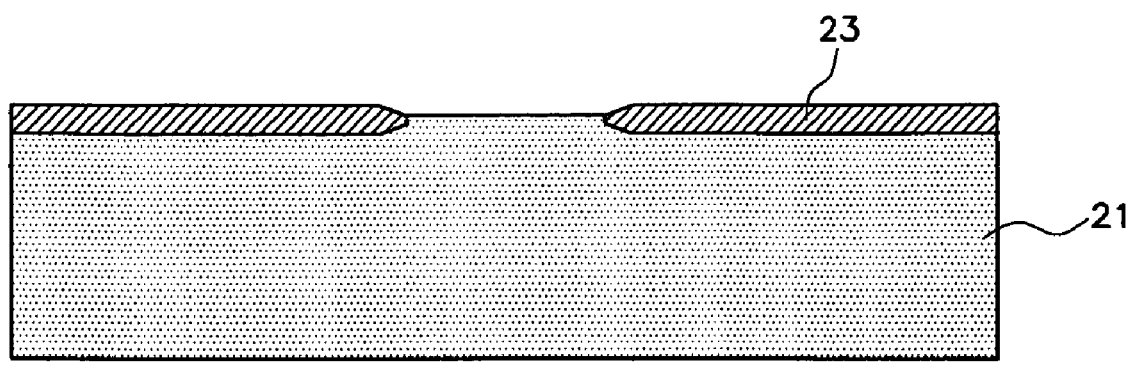

Referring to FIG. 2D, the mask pattern 22a is removed through a wet etching process to expose the semiconductor substrate 21 through the first oxide layer 23.

Figure 2E:
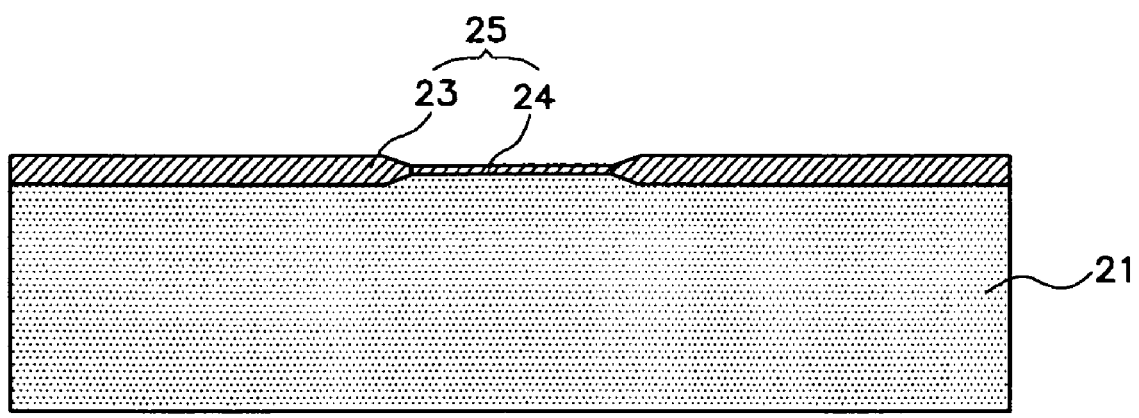

Referring to FIG. 2E, a second oxide layer 24 is formed on the exposed semiconductor substrate 21 at a thin thickness relative to the first oxide layer 23, so that a gate oxide layer 25 comprising the first and second oxide layers 23 and 24 with different thicknesses is formed. The second oxide layer 24 can be formed on the first oxide layer 23 as well as on the exposed semiconductor substrate 21.

Figure 2F:
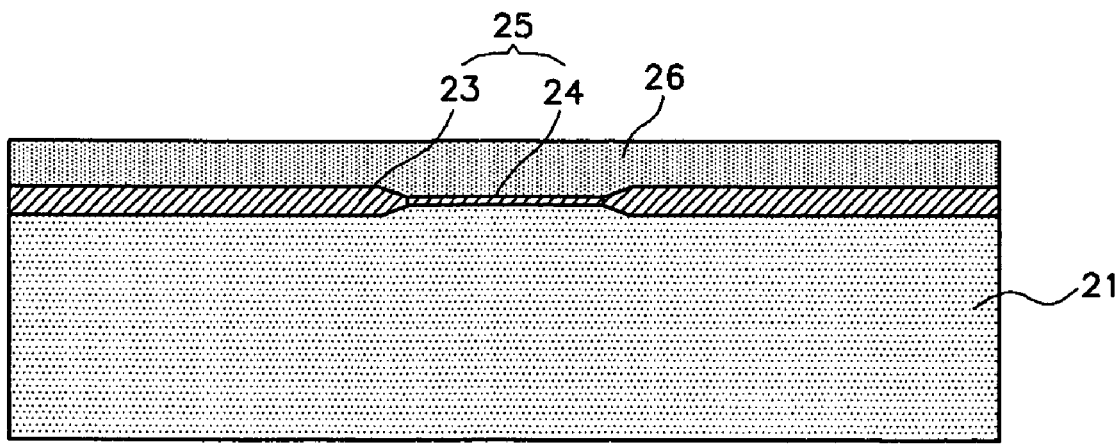

Referring to FIG. 2F, a polysilicon layer 26 is formed on the gate oxide layer 25 as a gate material layer.

Figure 2G:
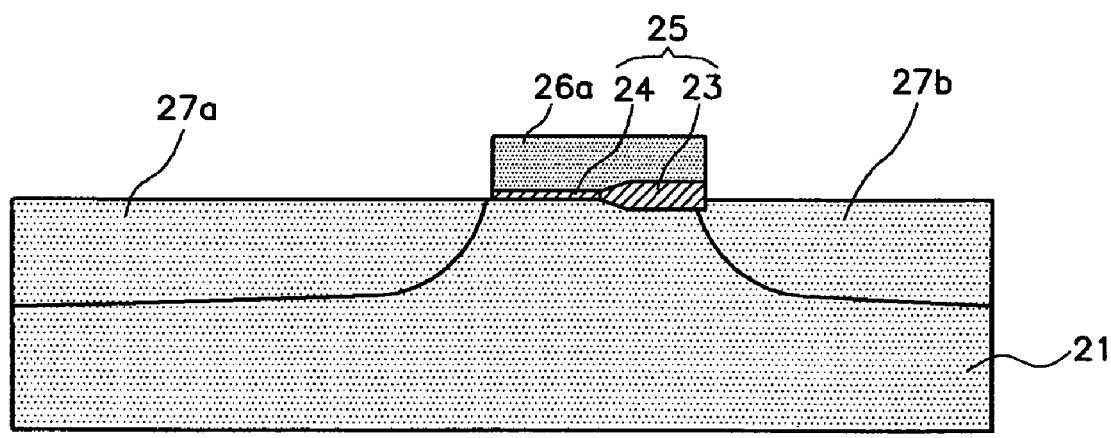

Referring to FIG. 2G, a second photoresist pattern (not shown) is formed on the polysilicon layer 26 through a photolithography process using the gate mask. The second photoresist pattern is disposed at an offset region relative to the gate region. Then, a gate 26a is formed by etching the polysilicon layer 26 using the second photoresist pattern as a mask. One side of the gate 26a is overlapped with the thick first oxide layer 23 and the other side of the gate 26a is overlapped with the thin second oxide layer 24. The gate oxide layer 25 is etched simultaneously.

Thereafter, the second photoresist pattern is removed by a well-known method. Impurity ions are then implanted to form source and drain regions 27a and 27b within the semiconductor substrate 21 on opposite sides of the gate 26a. Preferably, the drain region 27b is formed close to the first oxide layer 23 and the source region 27a is formed close to the second oxide layer 24. Also, for higher gate driving voltages and/or higher drain voltages, the boundary of the first and second oxide layers 23 and 24 is disposed closer to the source region 27a.

As described above, the gate oxide layer 25 around the drain region 27b has thicker thickness than around the source region 27a. As a result, it is possible to increase the threshold voltage at the thick gate oxide layer 25. Accordingly, the pinch-off point found in prior art MOS transistors as discussed above can be removed, thereby reducing the concentration of majority carriers and adjusting the speed of the minority carriers. Consequently, it is possible to minimize the penetration of the minority carriers into the gate oxide layer. As a result, the gate oxide layer is protected from deterioration and the properties and reliability of the MOS transistor is improved relative to prior art transistors exhibiting the pinch off problem discussed above.

From the foregoing, persons of ordinary skill in the art will readily appreciate that semiconductor devices have been disclosed which include: a semiconductor substrate, a gate formed on the semiconductor substrate, a gate oxide layer interposed between the semiconductor substrate and the gate, and source and drain regions formed within the substrate at opposite sides of the gate. The gate oxide layer has a first region and a second region. The second region is thicker than the first region.

From the foregoing, persons of ordinary skill in the art will readily appreciate that methods of manufacturing semiconductor devices have been disclosed which include: forming a mask pattern on a gate region of a semiconductor substrate, forming a first oxide layer on an area of the semiconductor substrate exposed by the mask pattern, removing the mask pattern to expose the gate region, forming a second oxide layer having a thinner thickness than the first oxide layer on the gate region to form a gate oxide layer comprising the first and second oxide layers, forming a gate material layer on the gate oxide layer, forming a gate by patterning the gate material layer, wherein one side of the gate is overlapped with the first oxide layer and other side of the gate is overlapped with the second oxide layer, and forming source and drain regions within the substrate at opposite sides of the gate.

It is noted that this patent claims priority from Korean Patent Application Serial Number 10-2003-0077926, which was filed on Nov. 5, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of manufacturing a semiconductor device, comprising:

forming a mask pattern on a gate region of a semiconductor substrate;

forming a first oxide layer on an area of the semiconductor substrate exposed by the mask pattern, the first oxide layer having a first thickness and a tapered profile at an edge of the mask pattern;

removing the mask pattern to expose the gate region;

forming a second oxide layer on the gate region to form a gate oxide layer comprising the first and second oxide layers, the second oxide layer having a second thickness, the second thickness being less than the first thickness;

forming a gate material layer on the gate oxide layer, forming a gate from the gate material layer, a first side of the gate overlapping the first oxide layer and a second side of the gate overlapping the second oxide layer; and forming source and drain regions within the substrate at opposite sides of the gate.

2. A method as defined in claim 1, wherein forming the gate comprises:

forming a second photoresist pattern on the gate material layer to offset the gate from the gate region;

etching the gate material layer using the second photoresist pattern as a mask; and removing the second photoresist pattern.

3. A method as defined in claim 1, wherein the source region is formed near the second oxide layer, and the drain region is formed near the first oxide layer.

4. A method as defined in claim 3, wherein a boundary of the first and second oxide layers is arranged closer to the source region for greater gate driving voltages or greater drain voltages then for smaller gate driving voltages or smaller drain voltages.

5. A method as defined in claim 1, wherein the mask pattern comprises a nitride layer.

6. A method as defined in claim 1, wherein forming the mask pattern comprises depositing a silicon nitride layer to a thickness of approximately 500 Å.

7. A method as defined in claim 6, wherein depositing the silicon nitride layer comprises a thermal treatment process or a plasma enhanced-chemical vapor deposition (PECVD) process.

8. A method as defined in claim 1, wherein the second oxide layer is formed on the first oxide layer and on the gate region.

9. A method as defined in claim 1, wherein forming the first oxide layer comprises growing a silicon oxide layer by a thermal treatment.

10. A method as defined in claim 9, wherein oxygen penetrates the semiconductor substrate under an edge of the mask pattern during the thermal treatment, resulting in growth of the silicon oxide layer under the edge of the mask pattern.

11. A method as defined in claim 9, wherein oxygen penetrates the semiconductor substrate under an edge of the mask pattern, resulting in a bird's bcak effect.

* * * * *